United States Patent [19]
Muraki

[11] Patent Number: 5,572,142
[45] Date of Patent: Nov. 5, 1996

[54] APPARATUS AND METHOD FOR DIAGNOSING PRESENCE OR ABSENCE OF BREAKAGE IN ELECTROMAGNETIC COIL MEANS APPLICABLE TO BREAKAGE DIAGNOSIS FOR STEPPING MOTOR

[75] Inventor: Hirotada Muraki, Atsugi, Japan

[73] Assignee: Nissan Motor Co., Ltd., Kanagawa, Japan

[21] Appl. No.: 434,719

[22] Filed: May 4, 1995

[30] Foreign Application Priority Data

May 6, 1994 [JP] Japan .................................. 6-094286
May 9, 1994 [JP] Japan .................................. 6-094713

[51] Int. Cl.$^6$ .................................................. G01R 31/02
[52] U.S. Cl. ............................................ 324/546; 324/388
[58] Field of Search ................................. 324/384, 388, 324/537, 541, 543, 544, 545, 546, 547, 555, 726

[56] References Cited

U.S. PATENT DOCUMENTS

| | | | |
|---|---|---|---|
| 4,490,799 | 12/1984 | Marino et al. | 324/388 |
| 4,969,443 | 11/1990 | DeBiasi | 324/388 |
| 5,019,779 | 5/1991 | Ookawa | 324/388 |

FOREIGN PATENT DOCUMENTS

| | | |
|---|---|---|
| 54-31824 | 8/1979 | Japan . |
| 54-109517 | 8/1979 | Japan . |
| 54-98413 | 8/1979 | Japan . |
| 60-215174 | 10/1985 | Japan . |
| 2-63098 | 12/1990 | Japan . |

*Primary Examiner*—Michael Tokar
*Attorney, Agent, or Firm*—Lowe, Price, LeBlanc & Becker

[57] ABSTRACT

In an apparatus and method for diagnosing presence of absence of a (wire) breakage in electromagnetic coil means such as a duty ratio controlled solenoid or at least one exciting coil portion between an end of a stator coil and a tap of a stepping motor, a checking circuitry is connected to a junction between the electromagnetic coil means and a driving transistor (switching element) to provide a checking pulse signal which provides a particular level only when an input duty ratio (pulsewidth modulated) signal is at a predetermined non-actuation (low) level and no breakage in the electromagnetic coil means occurs. In the embodiment, the checking pulse signal is sampled at a predetermined sampling period which is shorter than the period of the pulsewidth modulated signal. A historical memory in a sub CPU records (stores) a history of the sampled checking pulse signal. The diagnosis of whether the breakage of the electromagnetic coil means is present or absent is carried out on the basis of the presence or absence of the history of the particular level (predetermined high level) in the stored content, the sampled checking pulse signal during a predetermined diagnosis delay time duration.

25 Claims, 12 Drawing Sheets

FIG.2
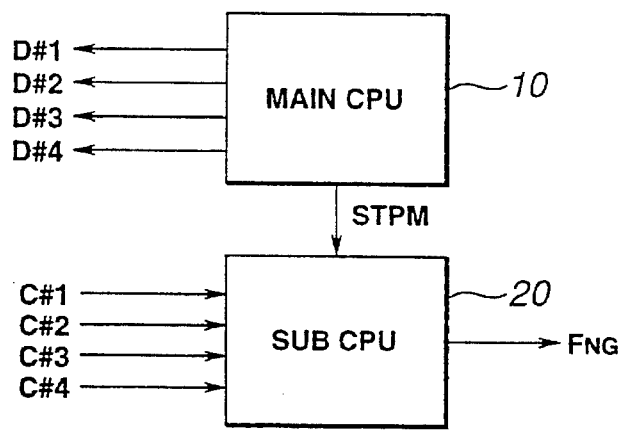
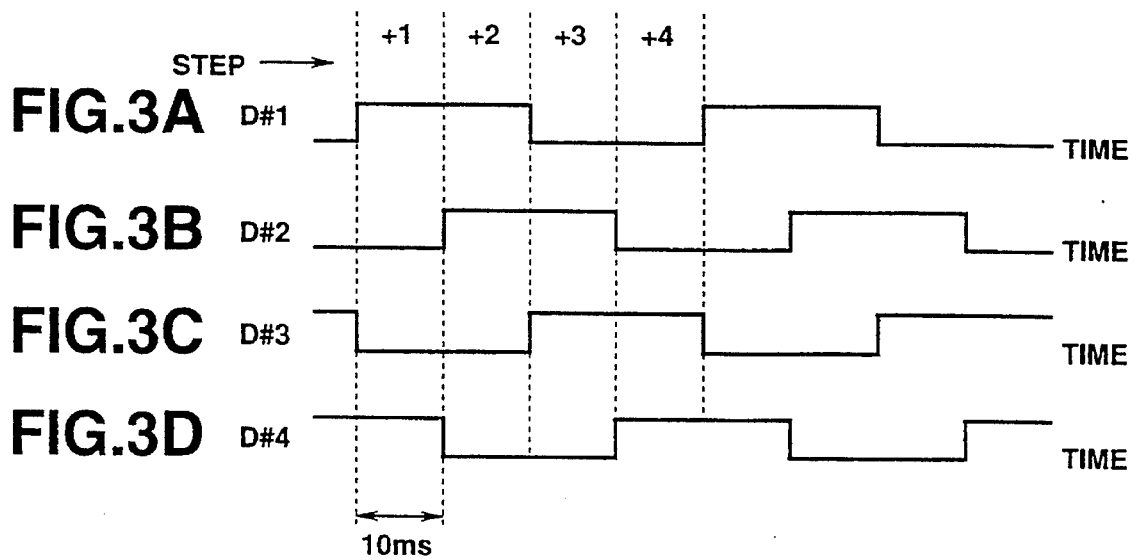

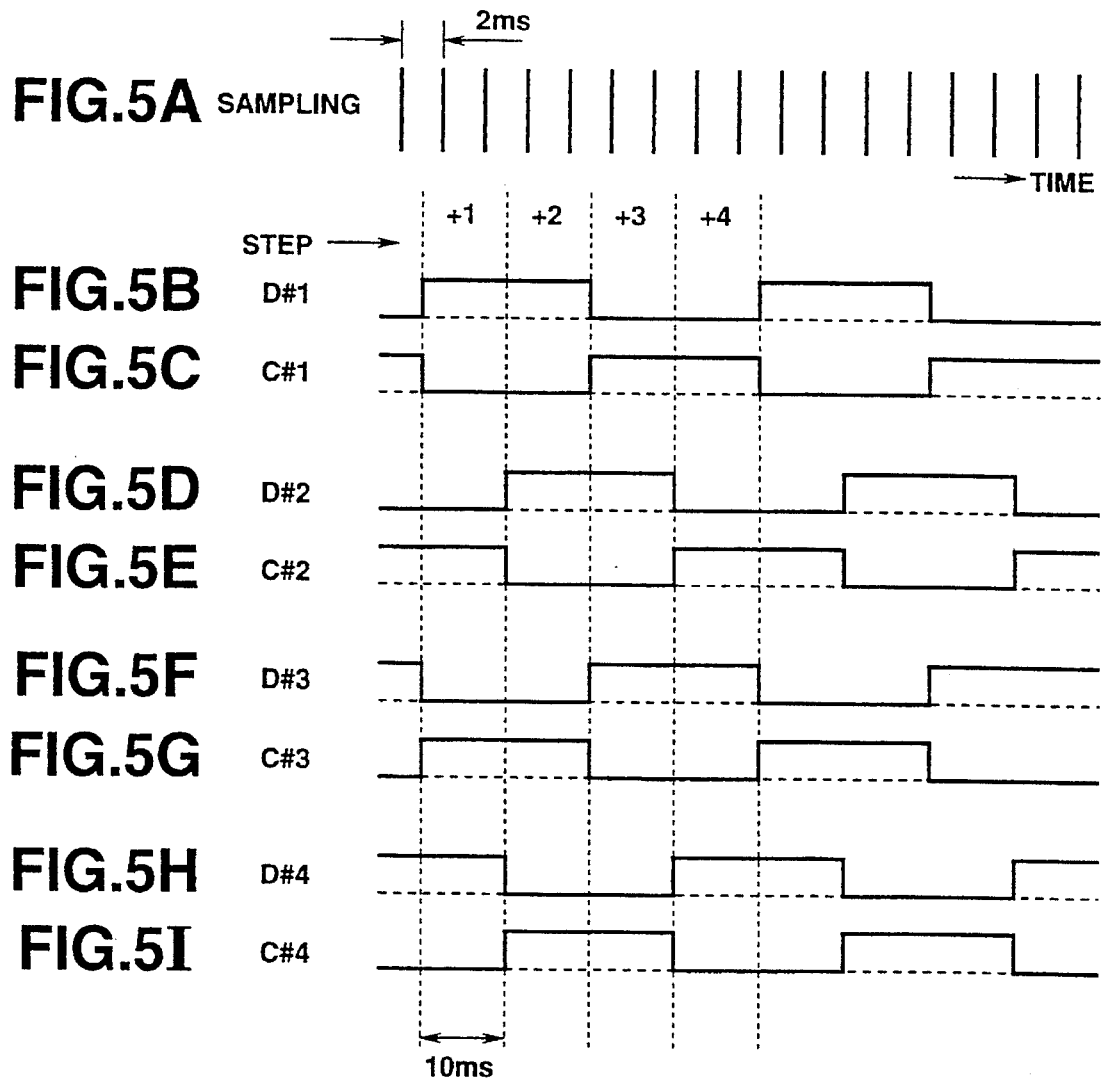

FIG.8

SOL (4-BIT DATA)

| CORRESPONDENCE | #1 | #2 | #3 | #4 |
|---|---|---|---|---|
| | 0 OR 1 | 0 OR 1 | 0 OR 1 | 0 OR 1 |

FIG.9

CHKDGN (4-BIT DATA)

| CORRESPONDENCE | #1 | #2 | #3 | #4 |
|---|---|---|---|---|
| | 0 OR 1 | 0 OR 1 | 0 OR 1 | 0 OR 1 |

FIG.10
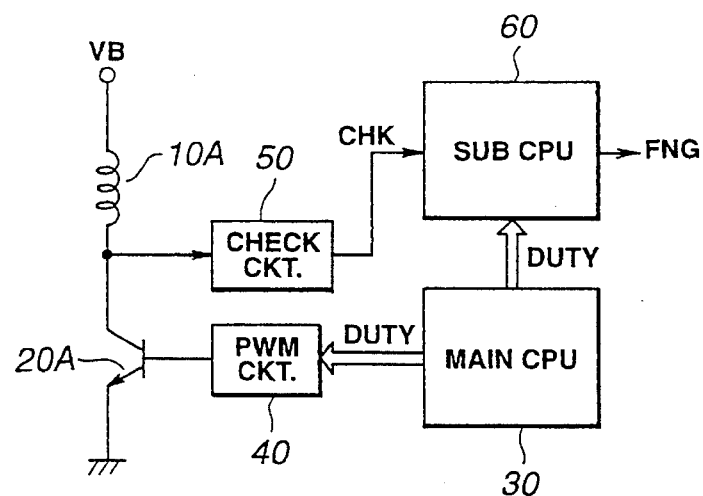
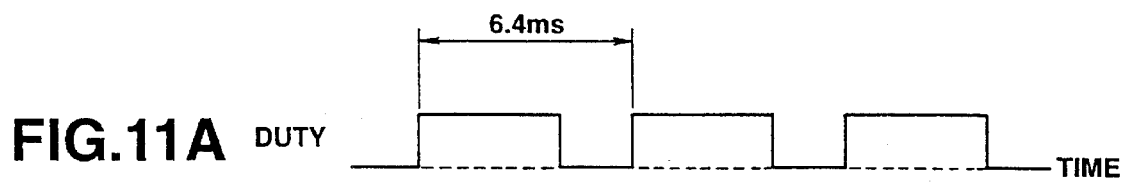
FIG.11A DUTY
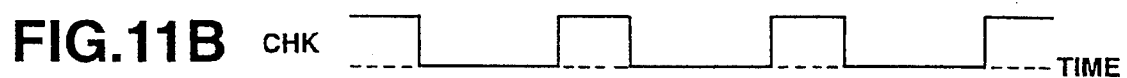
FIG.11B CHK
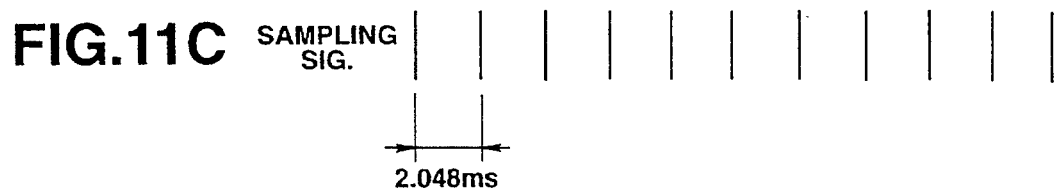
FIG.11C SAMPLING SIG.

APPARATUS AND METHOD FOR DIAGNOSING PRESENCE OR ABSENCE OF BREAKAGE IN ELECTROMAGNETIC COIL MEANS APPLICABLE TO BREAKAGE DIAGNOSIS FOR STEPPING MOTOR

BACKGROUND OF THE INVENTION

The present invention relates to a diagnosing apparatus and method for diagnosing the presence or absence of (wire) breakage of electromagnetic coil means applicable to a breakage diagnosis for a stepping motor.

A Japanese Patent Application First Publication No. Showa 60-215174 exemplifies a duty ratio controlled solenoid which drives an engine idling revolution speed control valve (ISC valve) disposed within an auxiliary air passage bypassing an intake air passage (including a throttle valve) in response to an input duty ratio varied pulse signal (hereinafter, also called a pulsewidth modulated signal) so as to derive an operating variable in proportion to a rate of an ON time duration (a duration of time during which the duty ratio varied pulse signal indicates a predetermined high level) to a period of the duty ratio varied signal, e.g., 6.4 ms.

In a case where the duty ratio controlled solenoid is used in such a situation as descried above, it is necessary to speedily detect a presence or absence in a breakage in the duty ratio controlled solenoid and to take a countermeasure against the detected breakage of the solenoid since it becomes difficult to perform a desired control with the breakage in the solenoid occurred.

Therefore, in the above-identified Japanese Patent Application First Publication, a current detecting circuit which detects an average value of a current flowing through the solenoid is installed so that the presence or absence in the breakage is detected on the basis of the average value of the current flowing through the solenoid.

However, since an expensive current monitor circuit is needed as the current detecting circuit, a cost of manufacturing the diagnosing apparatus becomes high. In addition, when the ON time duration of the duty ratio varied pulse signal is 0%, the current value gives zero irrespective of an absence or presence in the breakage of the solenoid so that the diagnosis whether the breakage in the solenoid occurs cannot completely be carried out.

In addition, a Japanese Patent Application Second (examined) Publication No. Heisei 2-63098 exemplifies stepping motors, one of which drives a purge control valve installed within a purge passage in order to purge a vaporized fuel from a canister on which the vaporized fuel from a fuel tank is adsorbed onto an intake air passage or the other of which drives the engine idling speed control valve (ISC valve) installed within the auxiliary air passage bypassing the intake air passage (throttle valve).

Such a stepping motor as described above is provided with a plurality of exciting coils on a stator, each exciting coil being excited (energized) in response to the predetermined high level of the duty ratio varied pulse signal having a constant duty ratio control period and being deenergized in response the predetermined low level of the input duty ratio varied signal in accordance with a predetermined sequential pattern of the exciting coil's excitation and deenergization (current interruption) so that the rotor has varied its angular position by one stepped number of time.

At any rate, in a latter case where the stepping motor is used in such situations as described above (engine idling speed control valve and purge control valve), it becomes difficult to perform a desired control when a (wire) breakage in at least one of the exciting coils of the stator occurs. It is necessary to speedily detect the breakage therein and to take a necessary countermeasure against the occurrence of the breakage. A checking signal circuit may be installed for each exciting coil which provides a checking pulse having a particular (logical) level only when no breakage in at least one exciting coil occurs with the input duty ratio varied pulse signal at either the predetermined high level or low level and the presence or absence in breakage of at least one exciting coil may be diagnosed according to the contents of the checking signals from the respective checking signal circuits. However, to carry out this diagnosis, it is necessary to determine whether the corresponding one of the checking signals is appropriate for the power supplied state of each exciting coil (ON time duration (predetermined high level) or OFF time duration (predetermined low level). In a case where the excitation and deenergization of each exciting coil of the stepping motor is carried out by a main CPU and the checking signals are provided for another sub CPU, it may be difficult for the sub CPU to detect the states of the input pulse duty ratio varied signal. Therefore, the diagnosis for tile breakage in such exciting coils as described above may not carried out.

SUMMARY OF THE INVENTION

It is an object of the present invention to provide diagnosing apparatus and method for diagnosing a presence or absence of a breakage in electromagnetic coil means which can assure the diagnosis of whether a breakage in the electromagnetic coil means occurs without detection of a predetermined high (H) level (ON time duration) or a predetermined low (L) level (OFF time duration) of a duty ratio varied pulse signal (pulsewidth modulated signal, or each of drive signals) to be supplied toward the electromagnetic coil means (driving transistor).

The above-described object can be achieved by providing an apparatus for diagnosing a presence or absence in a breakage of electromagnetic coil means, comprising: a) an exciting circuit having a power supply connected to the electromagnetic coil means and having a switching element which is so constructed and arranged as to be switched on to conduct a current flow to the electromagnetic coil means from said power supply in response to an input drive signal having a predetermined actuation level and as to be switched off to interrupt the current flow to the electromagnetic coil means in response to the input drive signal having a predetermined non-actuation level, the input drive signal being a pulse signal having a fixed period; b) observing means for observing a voltage level change on a junction between the electromagnetic coil means and the switching element so as to provide a checking pulse signal such that only when the input actuation signal is either at the predetermined actuation level or at the predetermined non-actuation level and no breakage of the electromagnetic coil means occurs, the checking pulse signal providing a particular level of either the predetermined actuation level or the predetermined non-actuation level; c) sampling means for sampling the checking pulse signal from the observing means at a sampling period which is different from a multiple of at least the period of the input drive signal; d) historical storing means for storing a history of the checking pulse signal which has been sampled by said sampling means; and e) diagnosing means for diagnosing a presence or absence in the breakage of the electromagnetic coil means on the basis of a stored content of said historical storing means.

The above-described object can also be achieved by providing a method for diagnosing a presence or absence in a breakage of electromagnetic coil means, said electromagnetic coil means constituting an exciting circuit having a power supply connected to the electromagnetic coil means and having a switching element which is so constructed and arranged as to be switched on to conduct a current flow to the electromagnetic coil means in response to an input drive signal having a predetermined actuation level and as to be switched off to interrupt the current flow to the electromagnetic coil means in response to the input drive signal having a predetermined non-actuation level, the input drive signal being a pulse signal having a fixed period, and said method comprising the steps of: a) observing a voltage level change on a junction between the electromagnetic coil means and the switching element so as to provide a checking pulse signal such that only when the input drive signal is either at the predetermined actuation level or at the predetermined non-actuation level and no breakage of the electromagnetic coil means occurs, the checking pulse signal providing a particular level of either the predetermined actuation level or the predetermined non-actuation level; b) sampling the checking pulse signal at a sampling period which is different from a multiple of at least the period of the drive signal; c) storing a previous history of the checking pulse signal which has been sampled at the step b); and d) diagnosing a presence or absence in the breakage of the electromagnetic coil means on the basis of a stored content at the step c).

BRIEF DESCRIPTION OF THE DRAWINGS

FIG. 2 is a schematic circuit block diagram for explaining a relationship between checking signals, pulse drive signals to be supplied to switching elements shown in FIG. 1, and inputs of two separate CPUs in the case of the first embodiment shown in FIG. 1.

FIGS. 3A, 3B, 3C, and 3D are integrally a timing chart for explaining phases of respective pulse drive signals shown in FIGS. 1 and 2.

FIGS. 5A, 5B, 5C, 5D, 5E, 5F, 5G, 5H, and 5I are timing charts of the input drive pulse signals to be supplied to the respective transistors, checking signals, and sampling period of a sampling signal in the case of so the first embodiment shown in FIG. 1.

FIG. 8 is an explanatory view of the sampled data.

FIG. 9 is an explanatory view of a historical data of a CHKDGN shown in FIG. 7.

FIG. 10 is a schematic circuit wiring diagram of a duty ratio controlled solenoid driving circuit to which a second preferred embodiment of the breakage diagnosis apparatus according to the present invention is applicable.

FIGS. 11A, 11B, and 11C are timing charts for explaining periods of the duty ratio varied (drive) signal DUTY, checking pulse signal CHK, and sampling period in the case of the second embodiment shown in FIG. 10.

FIGS. 15A, 15B, 15C, and 15 D are timing charts so of the sampling timing, the checking pulse signal CttK, and the duty ratio varied (drive) signal DUTY in the case of the second embodiment shown in FIG. 10.

BEST MODE CARRYING OUT THE INVENTION

Reference will hereinafter be made to the drawings in order to facilitate a better understanding of the present invention.

(First Embodiment)

Figure 1:
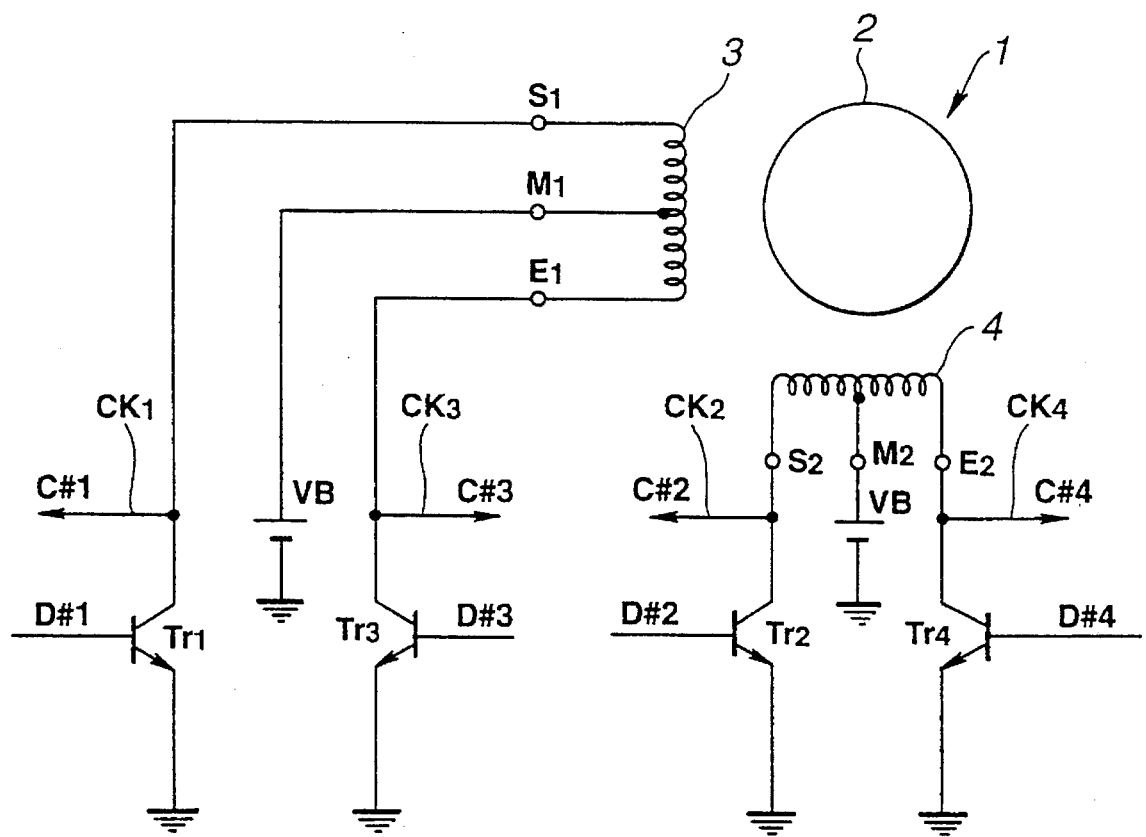
FIG. 1 is a schematic circuit wiring diagram of a unipolar bi-phase simultaneous exciting type stepping motor drive circuit to which a first preferred embodiment of an apparatus for diagnosing a presence or absence of breakage in electromagnetic coil means according to the present invention is applicable.
Figure 4A:
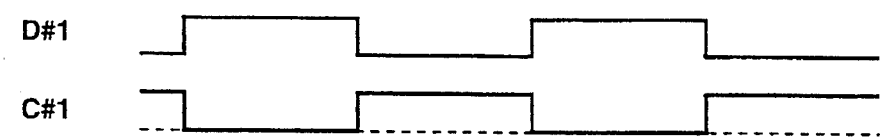
FIGS. 4A, 4B, 4C, and 4D are timing charts for the input drive pulse signals to be supplied to respective transistors shown in FIG. 1 and checking pulse signals shown in FIG. 1.
Figure 4B:
Figure 4C:
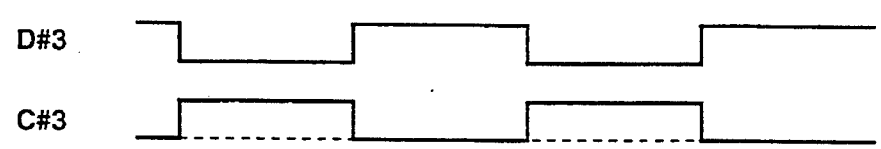
Figure 4D:
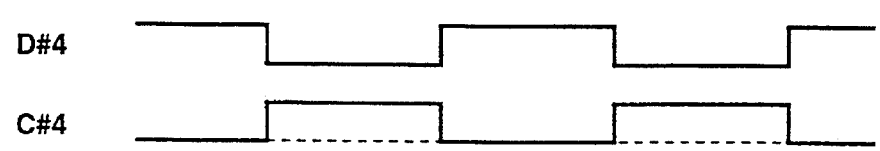

FIG. 1 shows a stepping motor driving circuit of a unipolar, bi-phase simultaneous exciting type stepping motor to which a first preferred embodiment of a diagnosing apparatus for diagnosing a presence or absence in breakage in at least one winding of a stator coil is applicable.

The stepping motor 1 is provided with a rotor 2 connected to a rotating axle (of a driven object) and a pair of stators 3 and 4 are arranged around the rotor 2, a stator (exciting) coil of these pair of stators 3 and 4 being wound in the same directions as shown in FIG. 1. In FIG. 1, winding start terminals (also called, first ends) of the respective stator coils 3 and 4 are denoted by $S_1$ and $S_2$. Winding end terminals of the respective stator coils (also called, second ends) 3 and 4 are denoted by $E_1$ and $E_2$. Furthermore, taps of the respective stator coils 3 and 4 are denoted by $M_1$ and $M_2$.

In one of the stator coils 3 and 4, a stator coil portion between the winding start terminal $S_1$ and tap $M_1$ is formed as a first-phase exciting coil #1. A stator coil portion between the winding end terminal $E_1$ and tap $M_1$ is formed as a third-phase exciting coil #3. In the other stator coil 4, a stator coil portion between the winding start terminal $S_2$ and the tap $M_2$ is formed as a second-phase exciting coil #2. A stator coil portion between the winding end terminal $E_2$ and the tap $M_2$ is formed as a fourth-phase exciting coil #4.

Two DC power supplies VB having the same voltage level are connected to the taps $M_1$ and $M_2$ of the respective exciting coils #1 through #4, respectively. Both the winding start terminals $S_1$ and $S_2$ and the winding end terminals $E_1$ and $E_2$ are grounded via respectively corresponding transistors $Tr_1$ through $Tr_4$.

In FIGS. 1 and 2, base ends of the respective (NPN type) transistors $Tr_1$ through $Tr_4$ are connected to respective drive terminals of a main CPU (Central Processing Unit) 10. When each the drive signals (or called pulse signals or pulsewidth modulated signals) D#1 through D#4 generated via the respective drive terminals from the main CPU 10 is at a predetermined high (H) level, each transistor $Tr_1$ through $Tr_4$ is turned to an ON state (in its conductive state), each power from the corresponding DC power supply VB is supplied through the corresponding one of the exciting coils #1 through #4.

In details, herein, a first-phase exciting circuit is formed by a first transistor $Tr_1$, the winding start terminal $S_1$, the first-phase exciting coil portion #1, the first tap $M_1$, and one of the DC power supplies. A third-phase exciting circuit is formed by the same one of the DC power supplies, the tap $M_1$, the third-phase exciting coil #3, the first winding end terminal $E_1$, and a third transistor $Tr_3$. A second-phase exciting circuit is formed by a second transistor $Tr_2$, the winding start terminal $S_2$, the second-phase exciting coil #2, the tap $M_2$, and the other of the DC power supplies. A fourth-phase exciting circuit is formed by the same other of the DC power supplies, the tap $M_2$, the fourth-phase exciting coil #4, the winding end terminal $E_2$, and a fourth transistor $Tr_4$.

A level of each drive signal D#1 through D#4 is varied in the following sequence shown in FIG. 3A through 3D.

In details, each drive signal D#1 through D#4 causes two phases of the four exciting stator coil portions, i.e., the four exciting coils #1 through #4 to be excited in the following sequence of four kinds of power supply states for each of 10 milliseconds (ms) by changing the levels of the corresponding drive signals D#1 through D#4; 1) simultaneous excitations of the first-phase exciting coils #1 and of the fourth-phase exciting coil #4; 2) simultaneous excitations of the first-phase exciting coils #1 and second-phase exciting coils #2; 3) simultaneous excitations of the second-phase exciting coil #2 and the third-phase exciting coil and 4) simultaneous excitations of the third-phase exciting coil #3 and fourth-phase exciting coil #4.

The power supply states of the exciting coils #1 through 24 are varied in accordance with a predetermined pattern at the constant power supply period (10 milliseconds) so that the rotor 2 of the stepping motor 1 has varied its angular position through a predetermined angular displacement corresponding to one step of the rotor angular displacement whenever the power supply state for the first-to-fourth phase exciting coils #1 through #4 is varied in the sequence for each of 1) through 4) described above.

On the other hand, as shown in FIGS. 1 and checking pulse signals C#1 through C#4 are picked up at respective junctions between the corresponding one of the respective four-phases exciting coils #1 through #4 and the corresponding one of the transistors $Tr_1$ through $Tr_4$, the respective checking pulse signals C#1 through C#4 being supplied to a sub CPU 20 (refer to FIG. 2).

When each drive signal D#1 through D#4 is at the predetermined high (H, actuation) level for the corresponding one of the respective exciting coils D#1 through D#4 (transistors $Tr_1$ through $Tr_4$), the checking pulse signal #1 through C#4 is always at the predetermined low (L) level irrespective of the presence or absence in the breakage of the respective exciting coils #1 through #4. If the respective drive signals D#1 through D#4 for the respective exciting coils #1 through #4 (transistors $Tr_1$ and $Tr_4$ are at the predetermined low (L) levels, the respective pulses in the checking pulse signals C#1 through C#4 are at the predetermined high (H) levels provided that the respective exciting coils #1 through #4 are normally operated (namely, no breakage is present). If the breakages in the four-phases exciting coils #1 through #4 occur, the respective checking pulse signals C#1 through C#4 are at the predetermined low (L) levels as denoted by dotted lines in FIGS. 4A through 4D.

Hence, each check pulse circuit $CK_1$ through $CK_4$ derives the checking pulse signals C#1 through C#4 having the predetermined high levels (H) only when no power supply state (drive signals are at the predetermined low (L) levels) for the respective exciting coils #1 through #4 and no breakage in the corresponding exciting coil occurs. If a history (or record) that all or the checking pulse signals C#1 through C#4 have recorded or have experienced the predetermined high levels of the pulse checking pulse signals C#1 through C#4, it is possible to diagnose that no breakage in each or the exciting coils C#1 through C#4 occurs.

Therefore, as shown in FIGS. 5A through 5I, the respective checking pulse signals C#1 through C#4 are sampled at a period which is different from a multiple of a predetermined time duration (10 ms) during which any two of the exciting coils #1 through #4 are simultaneously excited in response to the pulse (drive) signals (D#1 through D#4) input to the corresponding two (base ends) of the transistors $Tr_1$ through $Tr_4$ and the rotor 2 has varied its angular position by one stepped number of time (refer to the items 1) through 4) described above), or preferably sampled at the period (for example, 2 ms) which is shorter than the predetermined time duration during which any two of the exciting coils are excited in response to the pulse (drive) signals D#1 through D#4 input to the corresponding two of the transistors $Tr_1$ through $Tr_4$ and during which the rotor 2 has varied its angular position by one stepped number of time (one step). Therefore, the respective checking pulse signals C#1 through C#4 can be sampled at least once whenever the pattern in the power supply state, i.e, each excitation state of the item 1) through 4) described above is changed.

In addition, when the rotor 2 has varied its angular position by four stepped numbers of times (four steps) (but, in the case of the bi-phase, simultaneous excitation type stepping motor, equal to or more than only three stepped number of times (three steps)), any one of the checking pulse signals having the predetermined high (H) level can be estimated as having at least once been sampled when the checking pulse signals C#1 through C#4 corresponding to the respective exciting coils #1 through #4 have provided the predetermined high (H) levels.

Hence, the history of the sampled checking pulse signals C#1 through C#4 is stored in a memory of the sub CPU 20 for the respective exciting coils #1 through #4. Whenever the rotor 2 has varies its angular position by the four stepped numbers of times, namely, tile angular displacement of the rotor 2 is varied by the four stepped numbers of times, the presence or absence of the breakage in at least one of the exciting coils #1 through #4 is diagnosed on tile basis of the history (records) of the sampled checking pulse signals C#1 through C#4 for each variation of the angular displacement of the rotor 2 by the four stepped number of times.

It is noted that, as shown in FIGS. 3A, 3B, 3C, and 3D, the one step of the rotor angular displacement corresponds to the predetermined (half) time duration (10 ms) during which either two of the drive signals D#1 through D#4 are at the predetermined high levels (H). The period of each drive signal D#1 through D#4 corresponds to the four stepped numbers of times the rotor 2 has varied its angular position.

Figure 6:
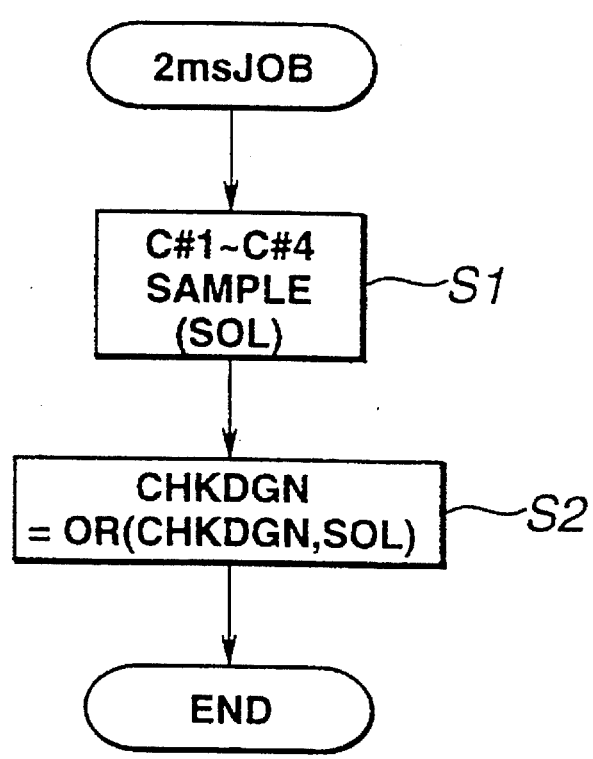
FIG. 6 is an operational flowchart executed by a sub CPU shown in FIG. 2 for sampling the checking pulse signals as a 2 ms job.
Figure 7:
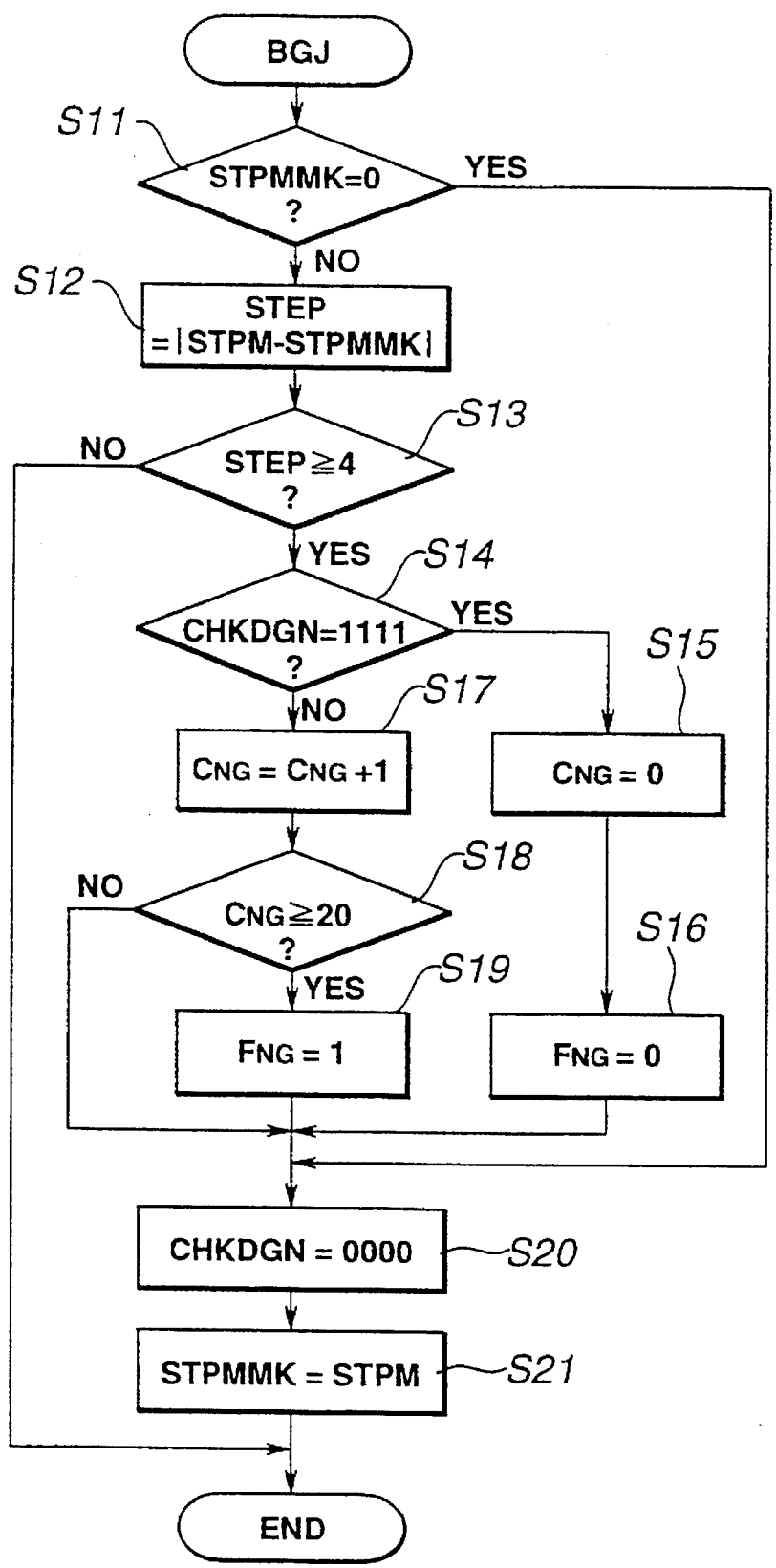
FIG. 7 is an operational flowchart executed by the sub CPU shown in FIG. 2 for executing a diagnostic routine in the case of the first embodiment shown in FIG. 1.

On the basis of the above-described principle of the first embodiment, the sub CPU 20 executes a sampling routine shown in FIG. 6 (2 ms job) and a diagnostic routine (background job, BGJ) shown in FIG. 7 so as to carry out a diagnosis of the breakage in at least one of the exciting coils #1 through #4 shown in FIG. 1.

FIG. 6 shows the subroutine as the 2 ms job executed by the sub CPU 20. The subroutine shown in FIG. 6 is executed for each of 2 milliseconds (ms). However, it is not always necessary for the subroutine shown in FIG. 6 to be executed for each of 2 milliseconds. FIG. 6 may be executed at a period further shorter than the power supplied excitation state period (10 milliseconds) during which any two of the exciting coils #1 through #4 are excited in response to the pulse (drive) signals D#1 through D#4 input to the corresponding two of the transistors $Tr_1$ through $Tr_4$ and the angular position of the rotor 2 is stepped by one stepped number of time.

That is to say, at a step S1, the sub CPU 20 samples the the checking pulse signals C#1 through C#4 from the respective check circuits $CK_1$ through $CK_4$ and derives a four-bit sampled data SOL.

Each bit of the sampled data SOL is exemplified by FIG. 8.

That is to say, each bit of the sampled data SOL corresponds to signal predetermined high (It) and low (L) levels, H="1" and L="0" of the respective checking pulse signals C#1 through C#4 corresponding to the respective exciting coils #1 through #4. For example, in a case where C#1=1, C#2=0, C#3=0, and C#4=1, SOL=1001.

At the next step S2, the sub CPU 20 takes a logical sum (OR) for each bit between a four-bit historical data CHKDGN (at the initial stage, CHKDGN=0000) stored in a historical recording RAM (Random Access Memory) included in the sub CPU 20 shown in FIG. 2) and the four-bit sampling data SOL (for example, SOL=1001) so as to update the historical data CHKDGN.

For example, in a case where CHKDGN=0000 and SOL=1001, the updated historical data CHKDGN=1001.

In addition, in a case where CHKDGN=1001 and SOL=1100, the updated historical data CHKDGN=1101.

In addition, CHKDGN=1101 and SOL=0110, the updated historical data CHKDGN=1111.

In this way, each bit of the updated historical data CHKDGN corresponds to each exciting coil #1 through #4 as shown in FIG. 9 a most significant bit of the four bit data corresponding to the first-phase exciting coil #1, a second most significant bit thereof corresponding to the second-phase exciting coil #2, a second least significant bit corresponding to the third-phase exciting coil #3, and a least significant bit corresponding to the fourth-phase exciting coil #4.

For example, if CHKDGN=1001, the checking pulse signals C#1 and C#4 corresponding to the exciting coils #1 and #4 have recorded the predetermined high (H) levels. In addition, if CHKDGN=1111, all of the checking pulse signals C#1 through C#4 indicate the predetermined high levels (H) for to all exciting coils #1 through #4.

Next, FIG. 7 shows the diagnostic routine executed by the sub CPU 20 as a background job (BGJ).

It is noted that, at an initialization immediately after a power supply to the sub CPU 20 is carried out, registers, flags, and/or counters such as STPMMK, $C_{NG}$, and $F_{NG}$ are cleared to zeros (STPMMK=0, $C_{NG}$=0, $_FNG$=0).

At a step S11, the sub CPU 20 determines whether a diagnosis reference stepped position flag STPMMK=0 or not. At the initial routine of FIG. 7, since STPMMK=0, the routine goes to a step S20 in which the historical data CHKDGN=0000. Then, at a step S21, the present stepped position STPM (for example, any one of 1 through 128 (=$2^7$)) is read and stored into the diagnosis reference stepped position (register) STPMMK=STPM and the present routine is ended.

It is noted that the information on the stepped position STPM is transferred from the main CPU 10 to the sub CPU 20, as shown in FIG. 2.

Referring back to FIG. 7, in a case where the diagnosis reference stepped position STPNIMK~0 at the step S11, the routine goes to a step S12.

At the step S12, the sub CPU 20 reads the present stepped position STPM (for example, any one of 1 through 128) and calculates an absolute value between the diagnostic reference position STPMMK and the present stepped position STPM, the absolute value thereof corresponding to the stepped number of times, STEP=|STPM−STPMMK| and the routine goes to a step S13.

At the step S13, the sub CPU 20 determines whether the stepped number of times STEP is equal to or larger than 4 (or, may alternatively be 3).

If the stepped number of times STEP is smaller than 4 (STEP <4) at the step S13, the present time is not at the diagnostic time and the present routine is directly ended.

However, if STEP≦4 at the step S13, the present time is the diagnostic time and the routine goes to a step S14.

At the step S14, the sub CPU 20 reads the four-bit historical data CHKDGN stored in the historical data storing RAM and determines whether CHKDGN indicates 1111.

If CHKDGN=1111 at the step S14 (Yes), all of the exciting coils are determined to be normal and the routine goes to a step S15 in which an NG counter $C_{NG}$ is reset to zero and the routine goes to a step S16 in which a breakage detecting flag $F_{NG}$ is reset to 0. Furthermore, the routine goes to a step S20 in which the historical data CHKDGN=0000 for the next diagnosis. Then at the step S21, the sub CPU 20 reads the present stepped position STPM and this stepped position STPM is stored as the diagnosis reference stepped position STPMMK=STPM and the present routine is ended.

On the other hand, if CHKDGN~1111 at the step S14, at least one of the exciting coils #1 through #4 is abnormal, i.e, the wire constituting one of the corresponding winding of the exciting coils #1 through #4 is broken and the routine goes to a step S17.

At the step S17, the sub CPU 20 counts up (increments by one) the NG counter $C_{NG}$ and the routine goes to a step S18. At the step S18, the sub CPU 20 determines whether a value of the NG counter $C_{NG}$ is equal to or more than a predetermined value (for example, 20).

If, on the contrary, NG counter $C_{NG}$<20, the routine goes to the step S20 in which the historical data CHKDGN=0000 for the next diagnosis and the routine goes to the step S21 in which the sub CPU 20 reads the present stepped position STPM and this read value of STPM is stored as the diagnosis reference stepped position STPMMK=STPM. Then, the present routine is ended.

On the other hand, if the NG counter $C_{NG}$≦20, the sub CPU 20 determines that at least one of the wire constituting the winding of the corresponding one of the exciting coils #1 through #4 is broken and the routine goes to a step S19 in which the breakage detecting flag $F_{NG}$ is set to 1 ($F_{NG}$1).

Thereafter, the routine goes to the step S20 in which the historical data CHKDGN=0000 for the next diagnosis and to the step S21 in which the sub CPU 20 reads the present stepped position STPM, this diagnostic reference stepped position STPMMK is set as STPMMK=STPM. Then, the present routine is ended.

It is noted when the breakage detecting flag FNG=1, the sub CPU 20 diagnoses that at least one wire constituting the winding of each of the exciting coils #1 through #4 has broken and outputs the flag $F_{NG}$ which is set to 1 as a warning signal to inform the state of the wire breakage, thereby a necessary countermeasure against the breakage being taken.

It is noted that, in the first embodiment according to the present invention, the diagnostic routine is executed whenever the angular displacement of the rotor 2 is varied equally to or more than a predetermined stepped number of times (four steps). Thus, in a case where the stepped position of the rotor 2 is not varied, the diagnosis cannot be made any more and the following problem would be raised.

For example, in a case where the stepping motor 1 is applied to the engine idling speed control valve, the state of the exciting coils is fixed and the rotor 2 is not angularly displaced in the stepwise manner after the quantity of air supplied to the engine becomes insufficient or excessive so that the engine revolution speed is reduced with respect to a target engine idling speed or increased and exceeded the target engine idling speed. At this time, although the stepping motor 1 is controlled so that the stepped position of the rotor 2 is varied so as to correct the engine idling speed to the target engine idling speed, the stepped position immediately after the presence in the breakage in the winding of at least one of the exciting coils #1 through #4 has been detected is placed in the vicinity to the stepped position under control (provided that a frequency thereof is rare (low)), the rotor 2 is often not varied through the four stepped number of times. In this case, the diagnosis described above cannot immediately be carried out.

However, the frequency of the above-descried situation is considerably low and there are many chances to vary the stepped position of the rotor 2 by means of such as a dashpot under an open loop control, although the variation in every four stepped number of times is not continuously derived. Therefore, in such a case as described above, it is possible to diagnose the presence or absence in the breakage of at least one winding of the exciting coils #1 through #4 soon.

(Second Embodiment)

FIG. 2 shows a driving circuit of a duty ratio controlled solenoid (hereinafter referred to as a duty ratio controlled electromagnetic coil in a broad sense of the term) to which a second preferred embodiment of the breakage diagnosing apparatus according to the present invention is applicable.

The electromagnetic coil 10A has one end connected to the DC power supply VB and the other end connected to a collector of a transistor 20A, an emitter thereof being grounded.

The main CPU 30 calculates an ON time rate of the duty ratio varied signal DUTY (duty ratio value; in a unit of %) to be applied to the transistor 20A via a pulsewidth modulation circuit 40 and outputs the calculated On time rate thereof to a pulsewidth modulation circuit 40. The pulsewidth modulation circuit 40 generates the duty ratio varied signal DUTY in which the rate of the ON time percentage within a constant duty ratio control period (for example, 6.4 ms (milliseconds)) so is varied in accordance with the calculated ON time rate calculated by the main CPU 30 and supplies the duty ratio varied (drive) signal DUTY to a base terminal of the transistor 20. The transistor 20A is in the conductive state when the duty ratio varied signal is at the predetermined high level (ON duration) so that the power is supplied to the electromagnetic coil 10A from the DC power supply VB.

Consequently, the electromagnetic coil 10A is driven according to an average drive current defined according to the ON time duration of the pulse duty ratio varied signal DUTY so that an operating variable in proportion to the ON time rate is obtained.

On the other hand, a signal line is drawn out from a junction between the electromagnetic coil 10A and transistor 20A and is input to the check circuit 50. The check circuit 50 derives the checking pulse signal (CHK) which provides a particular level (the predetermined high level in the second embodiment) only when the duty ratio signal is at the predetermined OFF state (L level) and no breakage in the electromagnetic coil 10A occurs. If the checking pulse signal is detected that the predetermined high level is recorded, it is possible to diagnose that no breakage occurs.

Hence, the checking pulse signal is sampled at the sampling period which is different from a multiple of the duty ratio controlled period (6.4 ms), preferably at the sampling period which is shorter than the duty ratio controlled period (6.4 ms), the sampled history of the checking pulse signal is stored, and the presence or absence in the breakage of the electromagnetic coil 10A is diagnosed on the basis of the stored content of the sampled and stored checking pulse signal.

Suppose herein that the duty ratio control period is 6.4 milliseconds. The sampling is carried out at 2 ms job usually used. The sampling period is supposed to be 2.048 ms which is an actual executing period of 2 ms job.

Figure 12:
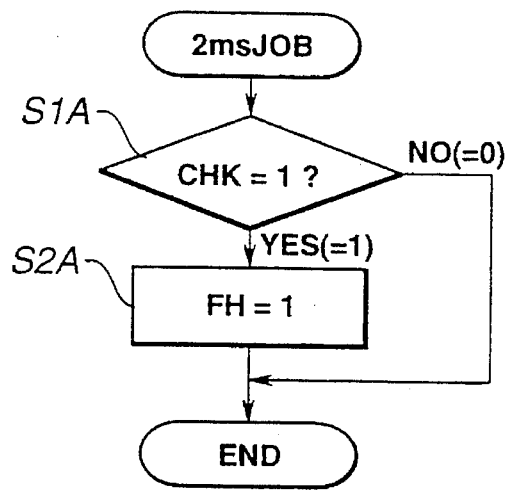
FIG. 12 is an operational flowchart executed by a sub CPU shown in FIG. 10 for executing a checking pulse signal sampling routine.
Figure 13:
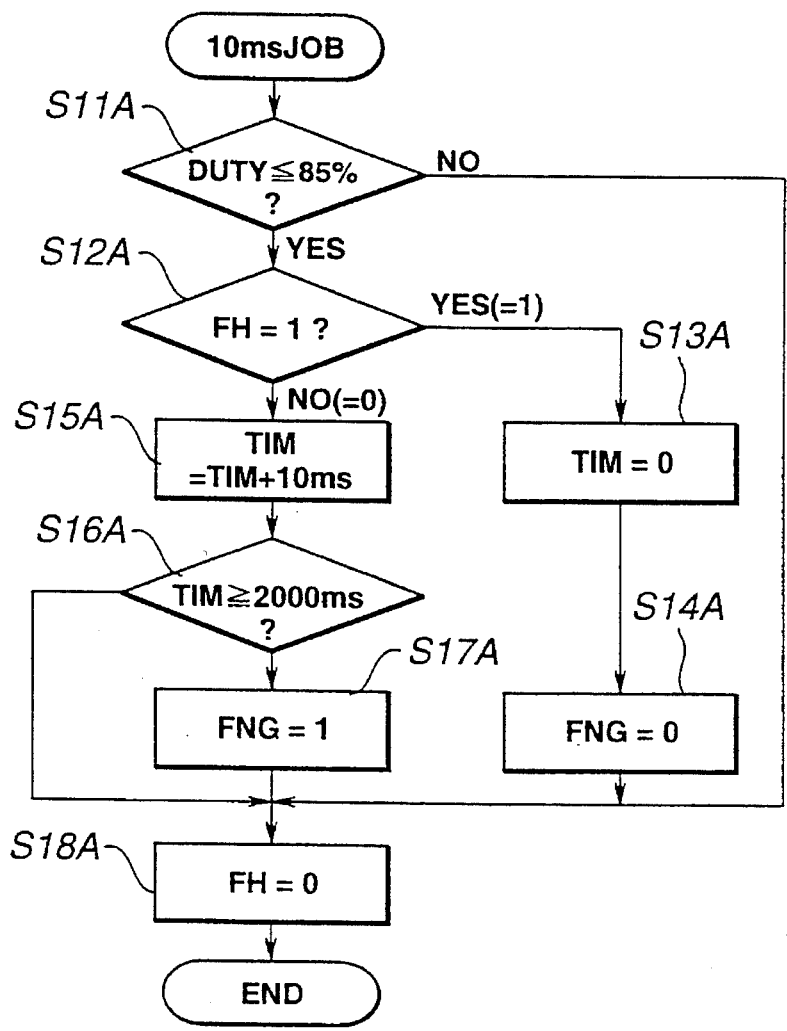
FIG. 13 is an operational flowchart executed by the sub CPU for executing the diagnostic routine in the case of the second embodiment shown in FIG. 10.

On the basis of the above-described principle, the presence or absence in the breakage is carried out at the sampling routine (2 ms job) shown in FIG. 12 and the diagnostic routine (10 ms job) shown in FIG. 13 are executed to perform the breakage diagnosis.

At a step S1A, the sub CPU 60 samples the checking pulse signal CHK from the check circuit 50.

As the result of sampling, if CHK=1 lo (predetermined high level) at which the sub CPU 60 can diagnose that no breakage occurs at the step S1A, the routine goes to a step S2A in which "1" is set to a history flag FH (FH=1), and the present routine is ended.

Next, FIG. 18 shows the diagnostic routine. This routine is executed for each 10 ms as 10 ms job.

At the step S11A, the duty ratio value DUTY (ON time duration rate of the duty ratio varied signal DUTY by means of the main CPU 30 is read into the sub CPU 30 and the sub CPU 30 determines whether the ON time duration rate is equal to or below a predetermined duty ratio upper limit value (for example, 85%) or not.

It is noted that, in the above-described case, as far as the OFF time duration rate (100%—DUTY) at which the checking pulse signal is at the particular level (H level) is concerned, it means that the sub CPU 30 determines whether the OFF time duration rate is equal to or below a predetermined diagnosis enabled lowest limit value (100%–85%= 15%).

In addition, the information on the duty ratio value (DUTY) is transferred from the main CPU 30 to the sub CPU 60.

Referring back to FIG. 13, if DUTY>85% (No) at tile step S11A, the sub CPU 60 determines that the diagnosis operation of the presence or absence in the breakage in the winding of the coil 10A is inhibited. Then, the routine goes to a step S18A in which the history flag FH is reset to zero. Thereafter, the present routine of FIG. 13 is ended.

On the other hand, if DUTY≦85% (Yes) at the step S11A, the sub CPU 60 determines that the diagnosis on the above-described breakage of the coil 10A is permitted and the routine goes to a step S12A.

At the step S12A, the sub CPU 60 determines whether a value of the history flag FH is determined.

If FH=1 (Yes) at the step S12A, the sub CPU 60 can instantaneously determine (diagnose) that the coil 10A has no wire breakage (normal) and the routine goes to a step S13A in which a diagnosing timer TIM is reset to zero and goes to a step S14A in which a breakage detecting flag $F_{NG}$ is reset to zero. Thereafter, the present routine is ended.

However, if the history flag FH=0 (No) at the step S12A, the routine goes to a step S15A in which the diagnosing timer TIM is counted up by 10 ms which is the execution period of the present routine of FIG. 13. Thereby, a continued time duration during which a zero state of the history flag FH (=0, a state in which the sub CPU 60 cannot diagnose that no breakage is present) is continued.

At the next step S16A, the sub CPU 60 determines whether the value of the timer TIM is equal to or longer than a predetermined diagnosis delay time duration (for example, 2000 milliseconds (ms)).

If TIM<2000 ms at the step S15A, the diagnosis described above is held for a certain period of time and the routine goes to the step S18A in which the history flag FH is reset to zero (FH=0). Then, the routine is ended.

If TIM≦2000 ms (Yes) at the step S16A, the sub CPU 60 determines that the breakage occurs and the routine goes to a step S17A in which the breakage detecting flag $F_{NG}$ is set to 1 (FNG=1). Then, the routine goes to the step 18A in which the history flag FH is reset to zero (FH=0) and the routine shown in FIG. 13 is ended.

If the breakage detecting flag FNG=1 at the step S17A, the occurrence in breakage in the winding of the coil 10A is determined and the sub CPU 60 outputs the breakage flag of FNG=1 used as a warning signal to, for example, the warning lamp to turn on the lamp so that a necessary countermeasure is taken. The necessary countermeasure of the breakage includes a replacement of the coil 10A.

In the above-described second embodiment, the duty ratio control period is set to 6.4 ms, the sampling period is 2.048 ms, the diagnosis delay time duration is set to 2000 ms, the diagnosis enabling lowest limit value of the OFF time duration rate when the checking pulse signal provides the predetermined high level (H) with no occurrence in the breakage of the coil is set to 15% ( in the duty ratio value DUTY which is the rate of the ON time duration is set to 85%). The reasons of setting the above-described values will be explained below.

Figure 14:
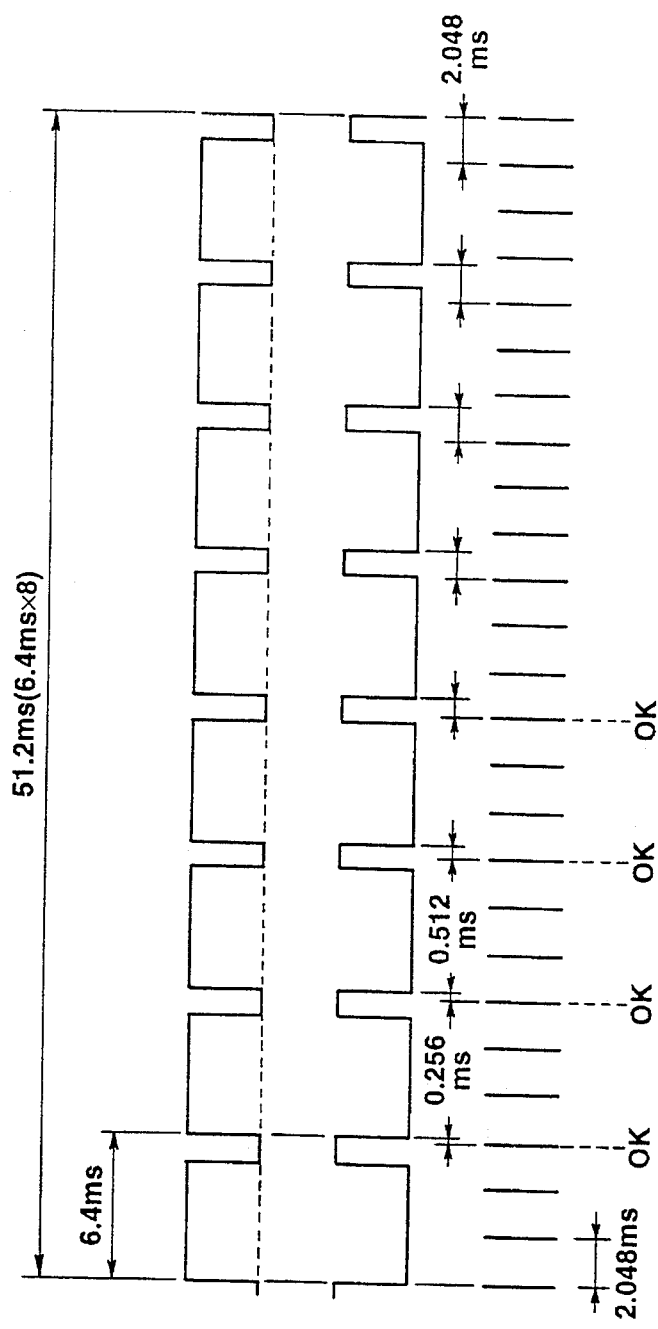
FIGS. 14A, 14B, 14C are timing charts for explaining the relationship between the period of sampling, the duty ratio varied pulse (drive signal, and checking pulse signal CHK.

FIGS. 14A, 14B, and 14C show the timing charts of the duty ratio varied (pulse) signal DUTY, the checking pulse signal CHK, and sampling signal SAMPLING, respectively.

As appreciated from FIGS. 14A through 14C, an interrupt is issued for each of 2.048 ms, with the duty ratio control period as 6.4 ms and the sampling period as 2.048 ms so that the checking pulse signal CHK having the period of 6.4 ms.

At this time, the sampling timing is deviated by 0.256 ms (a remainder of the division 6.4 ms/2.048 ms) whenever the time of 6.4 ms has passed so that the sampling period of 2.048 ms and the duty ratio control period of 6.4 ms are returned to the same phase when the time corresponding to a least common multiple of 51.2 ms has passed. The least common multiple of 51.2 ms corresponds to eight duty ratio periods.

Hence, the diagnosis delay time duration is set to equal to or longer than the least common multiple, i.e., 51.2 ms between the duty ratio control period of 6.4 ms and the sampling period of 2.048 ms.

In addition, since, under the above-described condition, the sampling timing is deviated by 0.256 ms for each of the duty ratio control period (corresponds to the period of the checking pulse signal), it is possible to diagnose the presence or absence in the breakage of the winding of the coil 10A if the time duration during which tile predetermined high (H) level of the checking pulse signal CHK is continued, hence, the OFF time duration during which the duty ratio varied signal DUTY is in the OFF state (predetermined low (L) level is equal to or longer than 0.256 ms.

Hence, the diagnosis enabling lowest limit value of the OFF time duration rate when the checking pulse signal CHK provides the particular level (namely, the predetermined high (H) level) needs to be set equal to or larger than a rate of the remainder time (0.256 ms) of the duty ratio control period of 6.4 ms divided by the sampling period 2.048 ms to the duty ratio control period (6.4 ms), namely, (0.256 ms/6.4 ms)×100=4%.

In addition, the duty ratio upper limit value, in the duty ratio value which indicates the ON time duration rate, needs to be set equal to or larger than such an equation as [(6.4 ms–0.256 ms)×100=96%.

It is, however, noted that since an erroneous diagnosis is resulted in with no consideration of a deviation and/ or time constants that the individual elements of the coil 10A and the connected transistor 20A naturally have, a mode in which the possibility of the erroneous diagnosis is a highest is supposed (refer to FIGS. 15A through 15D).

Figure 15:
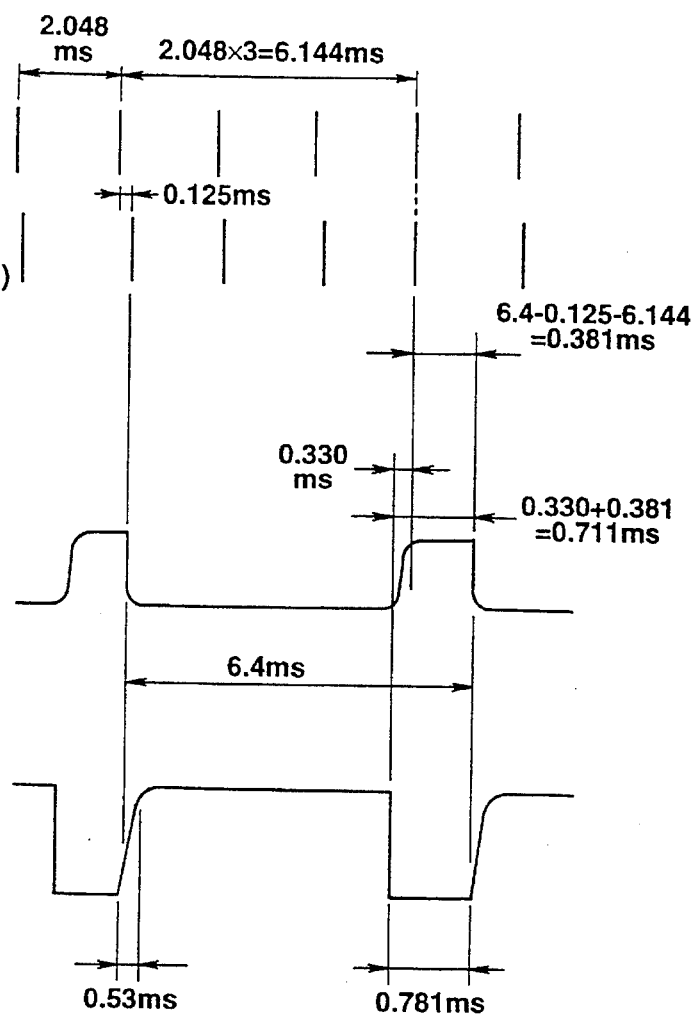

FIGS. 15A and 15B show a situation wherein an execution of the interrupt request lags with respect to an interrupt request for the sampling timing so that the present checking pulse signal CHK having the predetermined high (H) level is missed. In this case, it is necessary to permit the next coming checking pulse signal CHK having the predetermined high (H) level to be sampled.

To cope with such a situation as described above, suppose that a maximum delay time of the execution of the interrupt request to the interrupt request for the sampling timing is set to 0.125 ms. At this time, the next checking pulse signal CHK having the predetermined high (H) level can be sampled according to the execution of the interrupt request without delay to the interrupt request for the sampling timing at a time expressed as 2.048 ms×3=6.144 ms from a time at which the interrupt request for the previous sampling timing at which the predetermined high level of the checking pulse signal CHK has missed.

In order to satisfy the above-described condition, the time duration of the predetermined high (H) level required at minimum gives as follows, as appreciated from FIGS. 15A and 15B:

$$6.4\ ms - 0.125\ ms - 6.144\ ms = 0.381\ ms.$$

It is noted that, as shown in FIG. 15C, a delay of a rising edge, namely, 0.330 ms due to the presence in the time constant appears on the rising edge of each pulse of the checking pulse signal CHK.

With the above-described delay in mind, a time duration from the time at which the pulse of the checking pulse signal CHK rises to the time at which the pulse of the checking pulse signal falls is expressed below: 0.330 *ms*+0.381 *ms*=0.711 *ms*.

Hence, it is necessary for the OFF time duration of the corresponding duty ratio varied signal DUTY to be equal to or longer than 0.771 ms.

It is noted that although the time constant of 0.53 ms is present in the rising edge of the duty ratio varied signal DUTY as shown in FIG. 15D, it becomes effectively acted upon the diagnosis operation and that since a lag in the falling edge of the duty ratio varied signal is negligibly small, these time durations of the rising edge and falling edge of the duty ratio varied signal are not needed to be considered.

The diagnosis enabling lowest limit value of the OFF time duration when the checking pulse signal provides the particular level (H) when no occurrence in the breakage in the winding of the coil 10 is determined gives as follows: (0.711 *ms*/6.4 *ms*)×100=11.1%.

On the other hand, the duty ratio upper limit value until which the diagnosis is enabled in the duty ratio varied signal DUTY at which the rate of the ON time duration is determined gives as follows: [(6.4 *ms*–0.711 *ms*)/6.4 *ms*]×100= 88.9%.

However, in the second embodiment, with a further margin in mind, the diagnosis enabling lowest limit value of the OFF time duration rate when the checking pulse signal (CHK) provides the particular (H) level with no occurrence in the breakage in the winding of the coil 10 is set to 15%.

Thus, in the case of the duty ratio value of lo the duty ratio varied signal DUTY which is at the ON time duration, the duty ratio upper limit value enabling the diagnosis is (100– 15=)85%.

In addition, for the diagnosis delay time duration, 51.2 ms which is the least common multiple between the duty ratio control period of 6.4 ms and the sampling period of 2.048 ms is a minimum unit therefor.

If the diagnosis delay time duration is equal to or longer than the minimum unit, it is preferable to secure a long time as long time as possible. However, in a case where an actual breakage in the line constituting the winding of the coil 10A occurs and in a case where a control request shortens the time duration rate for the particular level provided by the checking pulse signal CHK, the sub CPU 60 calculates the time duration of transition from a diagnosis enabling region to a diagnosis disabling region according to a normal control requirement range during the normal state of the coil 10A and according to a control request variation rate immediately after the occurrence in the line breakage of so the coil 10A. Then, it is necessary to set the time duration shorter than the time duration of the transition calculated as described above.

That is to say, in a case where the electromagnetic coil 10 shown in FIG. 10 is applied to the duty ratio solenoid of the engine idling speed control valve, the idling speed control valve is generally closed after the occurrence in the breakage in the winding of the coil 10A so that the intake air quantity during the engine idling is insufficient, thereby the engine revolution speed during the idling being reduced below the target engine revolution speed. At this time, if the engine idling control is under a feedback control of the engine idling speed, the main CPU 30 enlarges the duty ratio value (ON time duration) so as to correct the present engine idling speed to the target engine idling speed.

Hence, it is necessary for the diagnosis delay time duration to be set so as to enable the diagnosis of whether the breakage in the winding of the coil 10A occurs before the duty ratio of the duty ratio varied signal exceeds the upper limit value (85%) below which the diagnosis described above is enabled.

Figure 16:
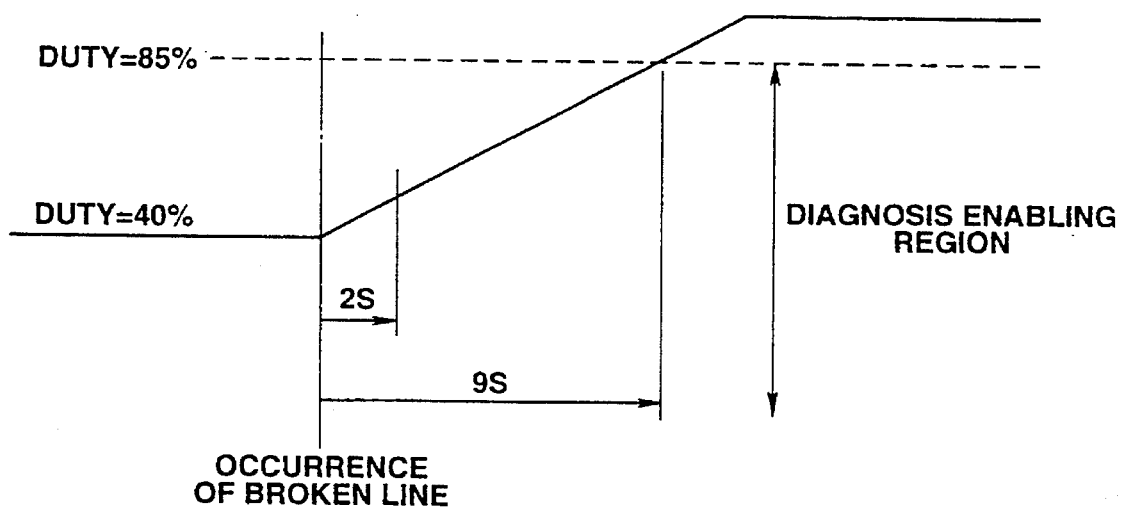
FIG. 16 is an explanatory view for explaining a diagnosis delay time duration in the case of the second embodiment.

FIG. 16 shows an explanatory view of a relationship between the diagnosis enabling region, the time at which the breakage in the winding of the coil 10A has occurred, and the rate of the ON time duration of the duty ratio varied signal DUTY when applied to the duty ratio controlled solenoid of the idling speed control valve.

Suppose that the breakage of the winding of the coil 10 has occurred while the duty ratio value is 40% (a usual value in average). At this time, the duty ratio of the duty ratio varied signal DUTY is increased at, for example, a gradient of about 5% (percent)/s (second) and it takes about 9 seconds until the duty ratio of the duty ratio varied signal DUTY has reached the upper limit value (DUTY=85%). Hence, if the diagnosis delay time duration is set to 2 seconds, the diagnosis of whether the breakage of the coil 10A occurs can be carried out at the time of DUTY=50%. In addition, even if the breakage of the coil 10A has occurred when the duty ratio value of the duty ratio varied signal DUTY increases and indicates 70% (DUTY=70%), the occurrence in the breakage can be diagnosed at the time of the duty ratio value DUTY=80%.

Consequently, the diagnosis delay time duration in the second embodiment is set to 2 seconds (=2000 ms) which is longer than 51.2 ms (which is the least common multiple of the control period of 6.4 ms and the sampling period of 2.048 ms).

Both of the duty ratio controlled solenoid 10 and the stepping motor 1 are applicable to an engine idling speed control valve installed in the auxiliary air passage bypassing the intake air passage of the engine.

It is finally noted that, in both embodiments, when the diagnosing apparatus finally diagnoses that the breakage has occurred in the electromagnetic coil means, the sub CPU provides the warning signal for, for example, the warning lamp to turn on the lamp so as to inform of the breakage occurrence in the electromagnetic coil means (exciting coils #1 through #4 and coil 10A).

Various types of embodiments and modifications can be made within the scope of the present invention which will be defined by the appended claims.

What is claimed is:

1. An apparatus for diagnosing a presence or absence in a breakage of electromagnetic coil means, comprising:

a) an exciting circuit having a power supply connected to the electromagnetic coil means and having a switching element which is so constructed and arranged as to be switched on to conduct a current flow to the electromagnetic coil means from said power supply in response to an input drive signal having a predetermined actuation level and as to be switched off to interrupt the current flow to the electromagnetic coil means in response to the input drive signal having a predetermined non-actuation level, the input drive signal being a pulse signal having a fixed period;

b) observing means for observing a voltage level change on a junction between the electromagnetic coil means and the switching element so as to provide a checking pulse signal such that only when the input actuation signal is either at the predetermined actuation level or at the predetermined non-actuation level and no breakage of the electromagnetic coil means occurs, the checking pulse signal providing a particular level of either the predetermined actuation level or the predetermined non-actuation level;

c) sampling means for sampling the checking pulse signal from the observing means are a sampling period which is different from a multiple of at least the period of the input drive signal;

d) historical storing means for storing a history of the checking pulse signal which has been sampled by said sampling means; and e) diagnosing means for diagnosing a presence or absence in the breakage of the electromagnetic coil means on the basis of a stored content of said historical storing means.

2. An apparatus for diagnosing a presence or absence in a breakage of electromagnetic coil means as claimed in claim 1, wherein said sampling means samples the checking pulse signal provided by the observing means at the sampling period which is shorter than the period of the input drive signal.

3. An apparatus for diagnosing a presence or absence in a breakage of electromagnetic coil means as claimed in claim 1, which further comprises warning means for providing a warning signal when said diagnosing means diagnoses that the breakage in said electromagnetic coil means is present.

4. An apparatus for diagnosing a presence or absence in a breakage of electromagnetic coil means as claimed in claim 1, wherein said diagnosing means diagnoses the presence in the breakage of the electromagnetic coil means when the history of the checking pulse signal stored in said historical storing means such that any one pulse of the sampled checking pulse signal which provides the particular level is not continuously present for a predetermined diagnosis delay time duration.

5. An apparatus for diagnosing a presence or absence in a breakage of electromagnetic coil means as claimed in claim 4, which fur tiler comprises diagnosis enabling means for enabling the diagnosis of the presence or absence in the breakage by the diagnosing means only when one of time duration rates at which any one pulse of the checking pulse signal provides the particular level when no breakage of the electromagnetic coil means occurs from among the time duration rates at one of which the pulsewidth modulated signal is at the predetermined actuation level and at the other of which the drive signal is at the predetermined non-actuation level gives equal to or larger than a predetermined diagnosis enabling lowest value.

6. An apparatus for diagnosing a presence or absence in a breakage of electromagnetic coil means as claimed in claim 5, wherein said predetermine diagnosis delay time duration is set equal to or longer than a least common multiple between the period of the drive signal and the period of sampling by said sampling means and wherein said predetermined diagnosis enabling lowest value is set equal to or larger than a rate of a remainder time of the period of the drive signal divided by the sampling period to the period of the drive signal.

7. An apparatus for diagnosing a presence or absence in a breakage of electromagnetic coil means as claimed in claim 6, wherein said sampling means, historical storing means, and diagnosing means constitute a sub CPU operating independently of a main CPU, the main CPU controlling a duty ratio of the drive signal and transferring an information on one of the time duration rates of the drive signal during which the predetermined actuation level is provided by the drive signal to the sub CPU and wherein said diagnosing enabling means constitutes the sub CPU, said sub CPU detecting a diagnosis enabling condition on the basis of the information on the rate of the time duration of the drive signal transferred from the main CPU.

8. An apparatus for diagnosing a presence or absence in a breakage of electromagnetic coil means as claimed in claim 6, wherein said observing means provides a pulse of the checking pulse signal which is at the particular level when the drive signal is at the predetermined non-actuation level and when no breakage of the electromagnetic coil means occurs.

9. An apparatus for diagnosing a presence or absence in a breakage of electromagnetic coil means as claimed in claim 8, wherein said switching element is an NPN transistor whose base is connected to the main CPU, whose collector is connected to the electromagnetic coil means, and whose emitter is connected to the ground, and whose collector is connected to said observing means and to the electromagnetic coil means.

10. An apparatus for diagnosing a presence or absence in a breakage of electromagnetic; coil means as claimed in claim 9, wherein said drive signal is a pulsewidth modulated signal and said particular level of each pulse of the checking pulse signal is a predetermined high level corresponding to a bit "1".

11. An apparatus for diagnosing a presence or absence in a breakage of electromagnetic coil means as claimed in claim 10, wherein the period of the pulsewidth modulated signal is 6.4 ms, the sampling period is 2.048 ms, and the predetermined diagnosis enabling lowest value is 15%.

12. An apparatus for diagnosing a presence or absence in a breakage of electromagnetic coil means as claimed in claim 11, wherein said predetermined diagnosis delay time duration is equal to or longer than 2000 milliseconds.

13. An apparatus for diagnosing a presence or absence in a breakage of electromagnetic coil means as claimed in claim 12, wherein said electromagnetic coil means comprises a duty ratio controlled solenoid applied to an idling speed control valve installed in an auxiliary air passage of an internal combustion engine.

14. An apparatus for diagnosing a presence or absence in a breakage of electromagnetic coil means as claimed in claim 1, wherein said electromagnetic coil means comprises a plurality of exciting coils and said switching element comprises a plurality of the same switching elements, each exciting coil having both ends and a tap, one end thereof being connected to the corresponding one of the switching elements, the other end thereof being connected to the corresponding other one of the switching elements, and said tap being connected to said power supply, at least two of each exciting coil portion between one of said ends and said tap being excited in response to the predetermined actuation level of the corresponding input drive signal and being deenergized in response to the input predetermined non-actuation level of the corresponding drive signal in a predetermined sequence so as to drive a rotor of a stepping motor to vary its angular position by one stepped number of time through a predetermined angular displacement, said exciting coils constituting stator coils of the stepping motor.

15. An apparatus for diagnosing a presence or absence in a breakage of electromagnetic coil means as claimed in claim 14, wherein said observing means comprises a plurality of checking circuits, each checking circuit being connected to a junction between the corresponding one of the exciting coil portions and the corresponding one of the switching elements and providing the checking pulse signal with respect to a corresponding one of the coil portions, said sampling means samples the respective checking pulse signals provided by said checking circuits at the sampling period which is different from a multiple of a time duration of each of the drive signals during the time duration of which the rotor varies its angular position by one stepped number of time through the predetermined angular position, said historical storing means stores the sampled checking pulse signals derived from the respective checking circuits.

16. An apparatus for diagnosing a presence or absence in a breakage of electromagnetic coil means as claimed in claim 15, wherein said diagnosing means diagnoses the presence or absence in the breakage of each exciting coil portion on the basis of a stored content of said historical storage means stored during a time at which the rotor of said stepping motor has varied its angular position by equal to or more than predetermined stepped numbers of times, said predetermined stepped number of times being such that the respective checking pulse signals from all of the checking circuits would provide the particular levels at least once or more if the breakages in all of the exciting coil portions were absent.

17. An apparatus for diagnosing a presence or absence in a breakage of electromagnetic coil means as claimed in claim 16, wherein said sampling means samples the respective checking pulse signals at the same sampling period which is shorter than the time duration of each of the drive signals during the time duration of which the rotor of the stepping motor varies its angular position by one stepped number of time.

18. An apparatus for diagnosing a presence or absence in a breakage of electromagnetic coil means as claimed in claim 17, wherein said diagnosing means diagnoses that no breakage in all of the exciting coil portions occurs when a history such that the checking pulse signals from all of the checking circuits have provided the same particular levels is stored in said historical storing means.

19. An apparatus for diagnosing a presence or absence in a breakage of electromagnetic coil means as claimed in claim 18, wherein said diagnosing means diagnoses that the breakage in at least one of the exciting coil portions has occurred when an impossible state of the diagnosis that no breakage in at least one of the exciting coil portions occurs is continued for a predetermined diagnosis number of times.

20. An apparatus for diagnosing a presence or absence in a breakage of electromagnetic coil means as claimed in claim 18, wherein said historical storing means comprises: updating means for updating the stored content whenever the rotor has varied its angular position by the predetermined stepped numbers of times; and clearing means for clearing the stored content thereof immediately after said diagnosing means has diagnosed the presence or absence in the breakage in at least one of the exciting coil portions.

21. An apparatus for diagnosing a presence or absence in a breakage of electromagnetic coil means as claimed in claim 20, wherein said sampling means, said historical storing means, checking circuits, and diagnosing means constitute a sub CPU operating independently of a main CPU, the main CPU transferring a stepped angular positional information of the rotor of the stepping motor to the sub CPU, said diagnosing means of the sub CPU including means for detecting a diagnosis time duration on the basis of the stepped angular positional information from the main CPU whenever the rotor has varied its angular position by the predetermined stepped number of times or more.

22. An apparatus for diagnosing a presence or absence in a breakage of electromagnetic coil means as claimed in claim 21, wherein said sampling period is 2 ms, the the duration of each of the drive signals is 10 ms, said predetermined stepped numbers of times is three or four, and said predetermined diagnosis numbers of times are 20.

23. An apparatus for diagnosing a presence or absence in a breakage of electromagnetic coil means as claimed in claim 22, wherein said stepping motor is applied to an idling speed control valve installed in an auxiliary air passage of an internal combustion engine.

24. A method for diagnosing a presence or absence in a breakage of electromagnetic coil means, said electromagnetic coil means constituting an exciting circuit having a power supply connected to the electromagnetic coil means and having a switching element which is so constructed and arranged as to be switched on to conduct a current flow to the electromagnetic coil means in response to an input drive signal having a predetermined actuation level and as to be switched off to interrupt the current flow to the electromagnetic coil means in response to the input drive signal having a predetermined non-actuation level, the input drive signal being a pulse signal having a fixed period, and said method comprising the steps of:

a) observing a voltage level change on a junction between the electromagnetic coil means and the switching element so as to provide a checking pulse signal such that only when the input drive signal is either at the predetermined actuation level or at the predetermined non-actuation level and no breakage of the electromagnetic coil means occurs, the checking pulse signal providing a particular level of either the predetermined actuation level or the predetermined non-actuation level;

b) sampling the checking pulse signal at a sampling period which is different from a multiple of at least a period of the drive signal;

c) storing a previous history of the checking pulse signal which has been sampled at the step b); and d) diagnosing a presence or absence in the breakage of the electromagnetic coil means on the basis of a stored content at the step c).

25. A method for diagnosing a presence or absence in a breakage of electromagnetic coil means as claimed in claim 24, which further comprises the step of e) providing a warning signal to a warning lamp to turn on the warning lamp when diagnosing at the step e) that the breakage of the electromagnetic coil means is present.

* * * * *